(12) United States Patent
Sharma et al.

(10) Patent No.: US 11,417,770 B2
(45) Date of Patent: Aug. 16, 2022

(54) VERTICAL THIN-FILM TRANSISTORS BETWEEN METAL LAYERS

(71) Applicant: Intel Corporation, Santa Clara, CA (US)

(72) Inventors: Abhishek Sharma, Hillsboro, OR (US); Nazila Haratipour, Hillsboro, OR (US); Seung Hoon Sung, Portland, OR (US); Benjamin Chu-Kung, Portland, OR (US); Gilbert Dewey, Beaverton, OR (US); Shriram Shivaraman, Hillsboro, OR (US); Van H. Le, Portland, OR (US); Jack T. Kavalieros, Portland, OR (US); Tahir Ghani, Portland, OR (US); Matthew V. Metz, Portland, OR (US); Arnab Sen Gupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 813 days.

(21) Appl. No.: 16/142,075

(22) Filed: Sep. 26, 2018

(65) Prior Publication Data

US 2020/0098931 A1 Mar. 26, 2020

(51) Int. Cl.
*H01L 29/786* (2006.01)
*H01L 29/49* (2006.01)
(Continued)

(52) U.S. Cl.
CPC .. *H01L 29/78642* (2013.01); *H01L 27/10805* (2013.01); *H01L 27/2454* (2013.01);
(Continued)

(58) Field of Classification Search
CPC ......... H01L 29/78642; H01L 27/10805; H01L 27/2454; H01L 29/4908; H01L 29/66969; H01L 29/78663; H01L 29/78672; H01L 29/78681; H01L 29/78684; H01L 29/7869; H01L 29/78693; H01L 29/78696; H01L 27/10873; H01L 21/823487; H01L 27/088; H01L 29/7788; H01L 29/41733; H01L 29/42384; H01L 29/45; H01L 29/458; H01L 29/6675; H01L 27/0688; H01L 27/124; H01L 29/66742
See application file for complete search history.

(56) References Cited

U.S. PATENT DOCUMENTS

| 9,276,092 B1 * | 3/2016 | Karda ................. H01L 29/7827 |
| 2013/0234242 A1 * | 9/2013 | Hwang ............... H01L 27/1052 |
| | | 438/270 |

* cited by examiner

*Primary Examiner* — Jonathan Han
(74) *Attorney, Agent, or Firm* — Schwabe, Williamson & Wyatt, P.C.

(57) ABSTRACT

Embodiments herein describe techniques for a thin-film transistor (TFT), which may include a substrate oriented in a horizontal direction and a transistor above the substrate. The transistor includes a gate electrode above the substrate, a gate dielectric layer around the gate electrode, and a channel layer around the gate dielectric layer, all oriented in a vertical direction substantially orthogonal to the horizontal direction. Furthermore, a first metal electrode located in a first metal layer is coupled to a first portion of the channel layer by a first short via, and a second metal electrode located in a second metal layer is coupled to a second portion of the channel layer by a second short via. Other embodiments may be described and/or claimed.

25 Claims, 15 Drawing Sheets

(51) Int. Cl.
*H01L 27/108* (2006.01)
*H01L 29/66* (2006.01)
*H01L 27/24* (2006.01)

(52) U.S. Cl.
CPC .... *H01L 29/4908* (2013.01); *H01L 29/66969* (2013.01); *H01L 29/7869* (2013.01); *H01L 29/78663* (2013.01); *H01L 29/78672* (2013.01); *H01L 29/78681* (2013.01); *H01L 29/78684* (2013.01); *H01L 29/78693* (2013.01); *H01L 29/78696* (2013.01)

VERTICAL THIN-FILM TRANSISTORS BETWEEN METAL LAYERS

FIELD

Embodiments of the present disclosure generally relate to the field of integrated circuits, and more particularly, to transistors.

BACKGROUND

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the backend, while leaving the silicon substrate areas for high-speed transistors. TFTs hold great potential for large area and flexible electronics, e.g., displays. Other applications of TFTs may include memory arrays. However, TFTs may be fabricated using a complicated process with limitations on the sizes of the TFTs and the gate lengths.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
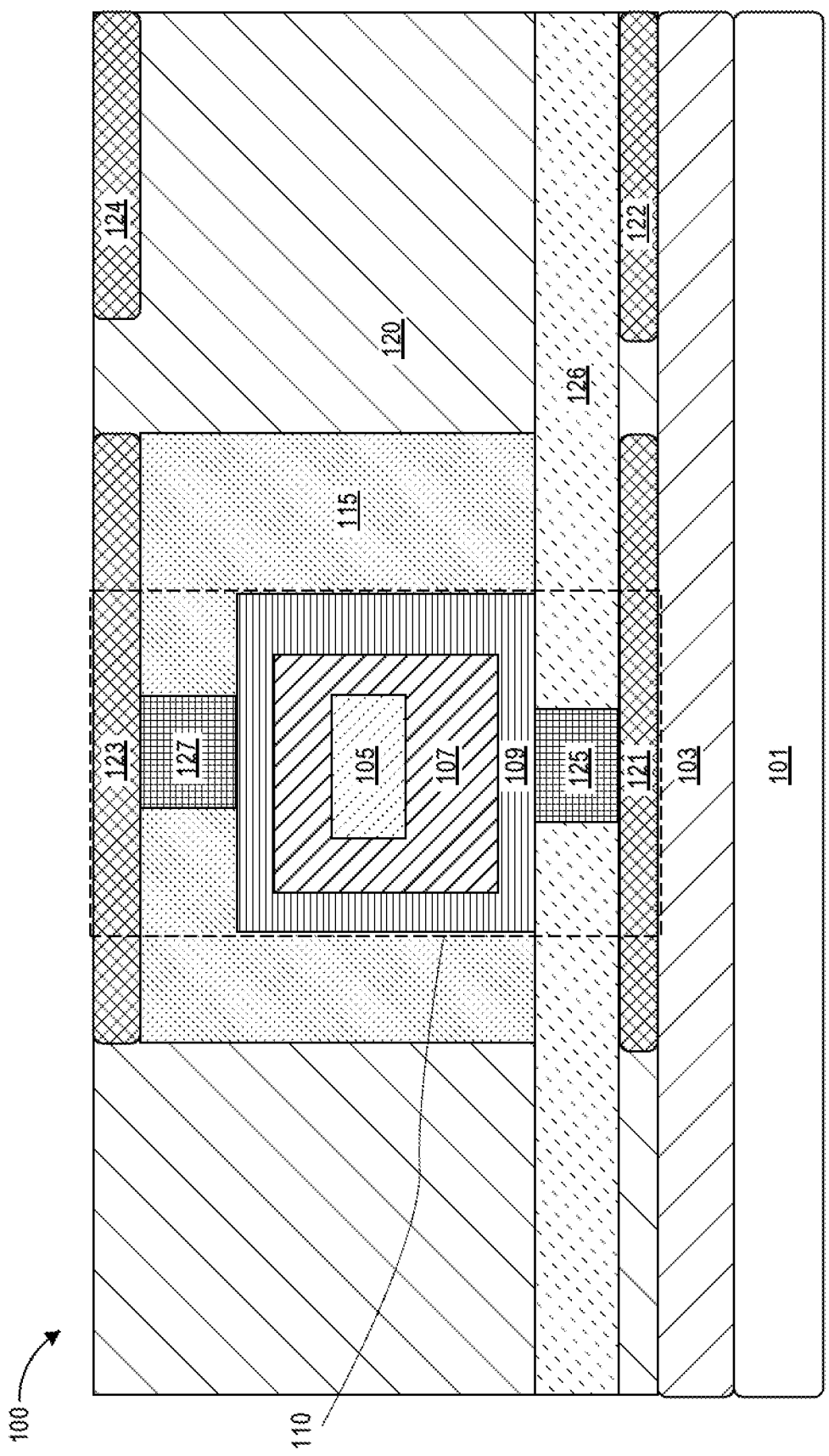
FIG. 1 schematically illustrates a diagram of a vertical thin-film transistor (TFT) between metal layers, in accordance with some embodiments.

An integrated circuit (IC) may contain various components or semiconductor devices to function together for many applications, e.g., a memory, a logic application, a radio frequency (RF) application. Fabrication of an IC may be divided into front-end-of-line (FEOL) semiconductor processing and back-end-of-line (BEOL) semiconductor processing. At FEOL, individual devices (e.g., transistors, capacitors, resistors, etc.) are patterned in a semiconductor substrate or layer. Following the FEOL operation, the result is typically a wafer with isolated transistors (e.g., without any wires). During BEOL, the individual devices are interconnected with wiring on the wafer, e.g., an interconnect structure with metallization layers. An interconnect structure may include multiple layers of conductors coupled to each other by vias through inter-level dielectric (ILD) layers separating the conductors. Normally, vias may be through an ILD layer to connect one conductor in a metal layer to another conductor in another metal layer. For modern IC processes, more than 10 metal layers may be added in the BEOL.

Thin-film transistors (TFT) have emerged as an attractive option to fuel Moore's law by integrating TFTs in the BEOL. TFTs may be fabricated in various architectures, e.g., a back-gated architecture, a top-gated architecture, or a vertical architecture. However, TFTs may typically be fabricated using a complicated process, resulting in large size TFTs and gate lengths.

Embodiments herein may present a vertical TFT between metal layers using short vias. A short via may connect two conductors within a same metal layer. A short via may be shorter than a normal via, which may couple a conductor in one metal layer to another conductor in another metal layer. A vertical TFT may include a gate electrode, a gate dielectric layer around the gate electrode, and a channel layer around the gate dielectric layer, all above a substrate oriented in a horizontal direction. On the other hand, the gate electrode, the gate dielectric layer, and the channel layer are within an ILD layer, oriented in a vertical direction substantially orthogonal to the horizontal direction. There may not be any source electrode or drain electrode of the vertical TFT within the ILD layer. A first metal electrode located in a first metal layer may be coupled to the channel layer by a first short via to act as a source electrode, while a second metal electrode located in a second metal layer may be coupled to the channel layer by a second short via to act as a drain electrode. Without using source electrode or drain electrode within the ILD layer, so formed vertical TFTs may be fabricated using a less complicated process, resulting in small sizes of the vertical TFTs.

Embodiments herein may present a semiconductor device. The semiconductor device includes a substrate oriented in a horizontal direction and a transistor above the substrate. The transistor includes a gate electrode above the substrate, and oriented in a vertical direction substantially orthogonal to the horizontal direction. A gate dielectric layer including a gate dielectric material is oriented in the vertical direction, around the gate electrode, and above the substrate. A channel layer including a channel material is oriented in the vertical direction, around the gate dielectric layer, and above the substrate. A first metal electrode located in a first metal layer is coupled to a first short via, and the first short via is coupled to a first portion of the channel layer and separated from the gate electrode. In addition, a second metal electrode located in a second metal layer is coupled to a second short via, and the second short via is coupled to a second portion of the channel layer and separated from the gate electrode.

Embodiments herein may present a method for forming a vertical TFT. The method may include forming a first short via coupled to a first metal electrode located in a first metal layer, and forming a channel layer including a channel material, wherein a first portion of the channel layer is coupled to the first short via. The first metal layer is above a substrate oriented in a horizontal direction, and the channel layer is oriented in a vertical direction substantially orthogonal to the horizontal direction. The method may also include forming a first dielectric layer including a gate dielectric material within an opening of the channel layer, where the first dielectric layer is oriented in the vertical direction, and adjacent to the channel layer. In addition, the method includes forming a gate electrode within an opening of the first dielectric layer, where the gate electrode is oriented in the vertical direction, and adjacent to the first dielectric layer. Furthermore, the method includes forming a second dielectric layer including a second dielectric material within the opening of the first dielectric layer, adjacent to the gate electrode, and coplanar with the first dielectric layer. Moreover, the method includes forming a second short via coupled to a second portion of the channel layer and separated from the gate electrode; and forming a second metal electrode located in a second metal layer, where the second metal electrode is coupled to the second short via.

Embodiments herein may present a computing device, which may include a circuit board, and a memory device coupled to the circuit board and including a memory array. In more detail, the memory array may include a plurality of memory cells. A memory cell of the plurality of memory cells may include a transistor and a storage cell. The transistor in the memory cell may include a gate electrode coupled to a word line of the memory array, where a substrate is below the gate electrode in a horizontal direction, and the gate electrode is above the substrate, oriented in a vertical direction substantially orthogonal to the horizontal direction. The transistor also includes a gate dielectric layer including a gate dielectric material, the gate dielectric layer oriented in the vertical direction, around the gate electrode, and above the substrate. In addition, the transistor includes a channel layer including a channel material, the channel layer oriented in the vertical direction, around the gate dielectric layer, and above the substrate. A first metal electrode is located in a first metal layer and coupled to a bit line of the memory array. The first metal electrode is coupled to a first short via above the channel layer, and the first short via is coupled to a first portion of the channel layer and separated from the gate electrode. A second metal electrode is located in a second metal layer and coupled to a first electrode of the storage cell. In addition, the second metal electrode is coupled to a second short via below the channel layer, and the second short via is coupled to a second portion of the channel layer and separated from the gate electrode. Furthermore, the storage cell may have a second electrode coupled to a source line of the memory array.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of a vertical TFT 110 between metal layers, e.g., a metal layer 122 and a metal layer 124, in accordance with some embodiments. For clarity, features of the vertical TFT 110, the metal layer 122, and the metal layer 124 may be described below as examples for understanding an example vertical TFT between metal layers. It is to be understood that there may be more or fewer components within a vertical TFT and metal layers. Further, it is to be understood that one or more of the components within a vertical TFT and the metal layers may include additional and/or varying features from the description below, and may include any device that one having ordinary skill in the art would consider and/or refer to as a vertical TFT between metal layers.

In embodiments, an IC 100 includes a substrate 101, an ILD layer 103 above the substrate 101, and the vertical TFT 110 above the substrate 101 and the ILD layer 103. The vertical TFT 110 includes a gate electrode 105 above the substrate 101, a gate dielectric layer 107, a channel layer 109, a first short via 125, a first metal electrode 121, a second short via 127, and a second metal electrode 123. A passivation layer 115 is around the channel layer 109 and the second short via 127. The first short via 125 is within or through an etching stop layer 126. The first metal electrode 121 is located in the metal layer 122, the second metal electrode 123 is located in the metal layer 124, and the metal layer 122 is separated from the metal layer 124 by an ILD layer 120. The gate electrode 105, the gate dielectric layer 107, the channel layer 109, the first short via 125, and the second short via 127 are within the ILD layer 120 above the substrate 101.

In embodiments, the substrate 101 is oriented in a horizontal direction. The gate electrode 105 is above the substrate 101, oriented in a vertical direction substantially orthogonal to the horizontal direction. In detail, the gate electrode 105 oriented in the vertical direction may mean that the gate electrode 105 is oriented in a vertical direction substantially perpendicular or orthogonal to the plane defined by the substrate 101 that is oriented in the horizontal direction. A first direction may be substantially perpendicular or orthogonal to a second direction when there is +/−10 degrees of orthogonality between the two directions. For example, the substrate 101 may be in the horizontal direction, while the gate electrode 105 may be oriented in a vertical direction above the substrate 101 when the gate electrode 105 may form 80 degree or 100 degree with the horizontal direction.

Figure 2A:
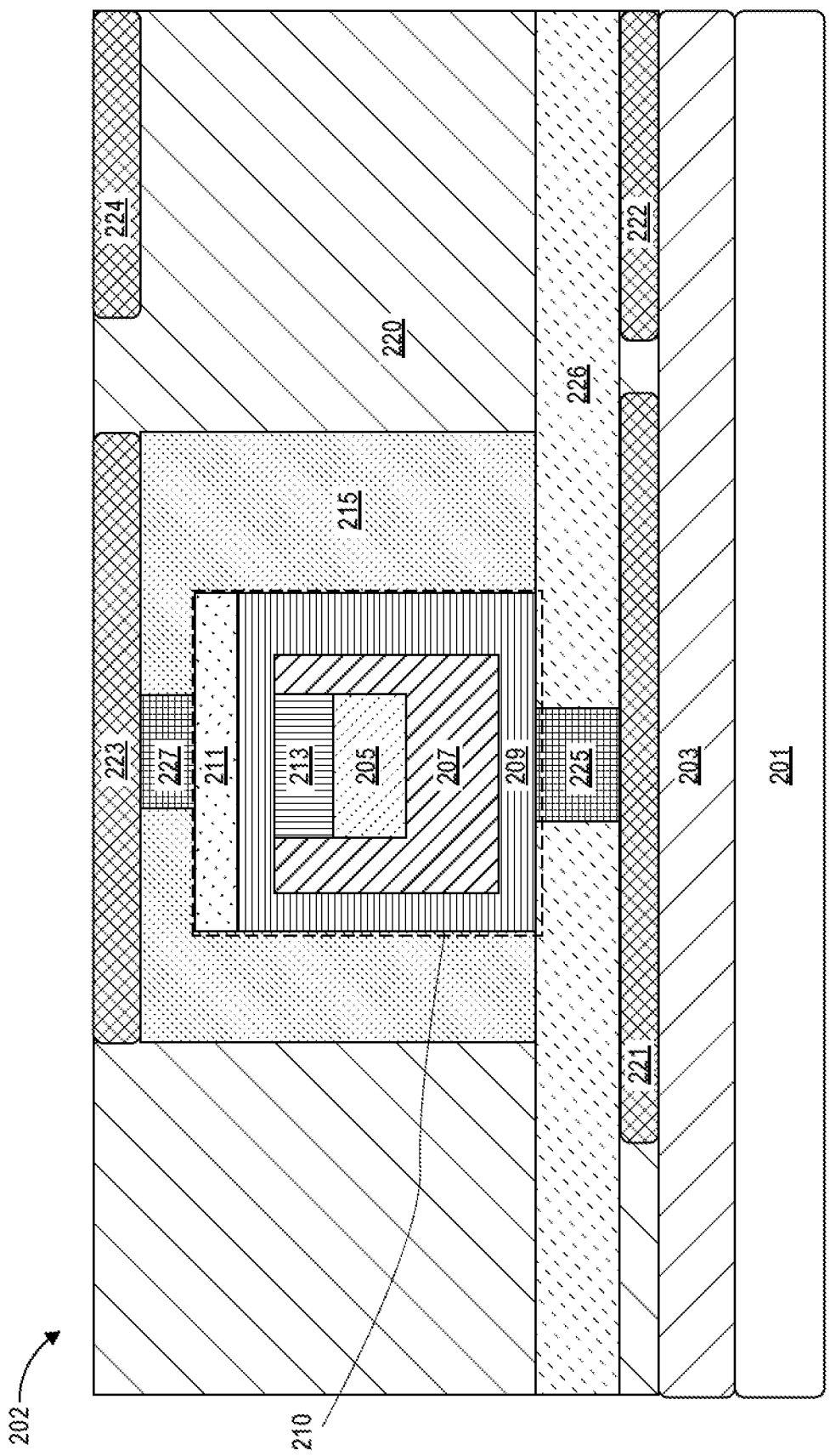
FIGS. 2(a)-2(c) schematically illustrate diagrams of various vertical TFTs between metal layers, in accordance with some embodiments.

In embodiments, the gate dielectric layer 107 includes a gate dielectric material, and is oriented in the vertical direction, around the gate electrode 105, and above the substrate 101. The gate dielectric layer 107 may be completely around the gate electrode 105 as shown in FIG. 1, or partially around the gate electrode 205, e.g., as shown in FIG. 2(a), or FIG. 2(c).

In embodiments, the channel layer 109 includes a channel material, and is oriented in the vertical direction, around the gate dielectric layer 107, and above the substrate 101. A cross section of the channel layer 109 may be of a shape selected from the group consisting of a rectangular shape, a circular shape, a triangular shape, a square shape, and a polygon shape. For example, in some embodiments, a cross section of the channel layer 109 may be of a rectangular shape with a width of a minimal feature size.

In embodiments, the first short via 125 is below the channel layer 109, in contact with a first portion of the channel layer 109, and separated from the gate electrode 105. The first portion may be a source area of the channel layer 109. The first short via 125 is to couple the first metal electrode 121 located in the metal layer 122 to the channel layer 109. The second short via 127 is above the channel layer 109, in contact with a second portion of the channel layer 109, and separated from the gate electrode 105. The second portion may be a drain area of the channel layer 109. The second short via 127 is to couple the second metal electrode 123 located in the metal layer 124 to the channel layer 109. The first short via 125 may be within or through the etching stop layer 126 adjacent to the metal layer 122. Similarly, the second short via 127 may be within or through an etching stop layer adjacent to the metal layer 124.

In embodiments, the first short via 125 and the first metal electrode 121 together may function as a source electrode, while the second short via 127 and the second metal electrode 123 together may function as a drain electrode. The source electrode and the drain electrode may be interchangeable. Different from a normal TFT design where a source electrode or a drain electrode is within an ILD layer, the vertical TFT 110 has the first metal electrode 121 and the second metal electrode 123 at two different metal layers separated by the ILD layer 120.

In embodiments, the metal electrode 121, the second metal electrode 123, the gate electrode 105 may include titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, or an alloy of Ti, Mo, Au, Pt, Al, Ni, Cu, Cr, TiAlN, HfAlN, or InAlO.

In embodiments, the channel layer 109 may be a n-type doped channel or a p-type doped channel. The channel layer 109 may include a material such as: $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, or a group-VI transition metal dichalcogenide.

In embodiments, the substrate 101 may be a silicon substrate, a glass substrate, such as soda lime glass or borosilicate glass, a metal substrate, a plastic substrate, or another suitable substrate. Other dielectric layer or other devices may be formed on the substrate 101, not shown for clarity.

In embodiments, the ILD layer 103 or the ILD layer 120 may include silicon dioxide ($SiO_2$), carbon doped oxide (CDO), silicon nitride, $O_3$-tetraethylorthosilicate (TEOS), $O_3$-hexamethyldisiloxane (HMDS), plasma-TEOS oxide layer, perfluorocyclobutane, polytetrafluoroethylene, fluorosilicate glass (FSG), organic polymer, silsesquioxane, siloxane, organosilicate glass, or other suitable materials.

In embodiments, the gate dielectric layer 107 may include a high-K dielectric material selected from the group consisting of hafnium silicate, zirconium silicate, hafnium dioxide, zirconium dioxide, aluminum oxide, and nitride hafnium silicate.

Figure 2B:
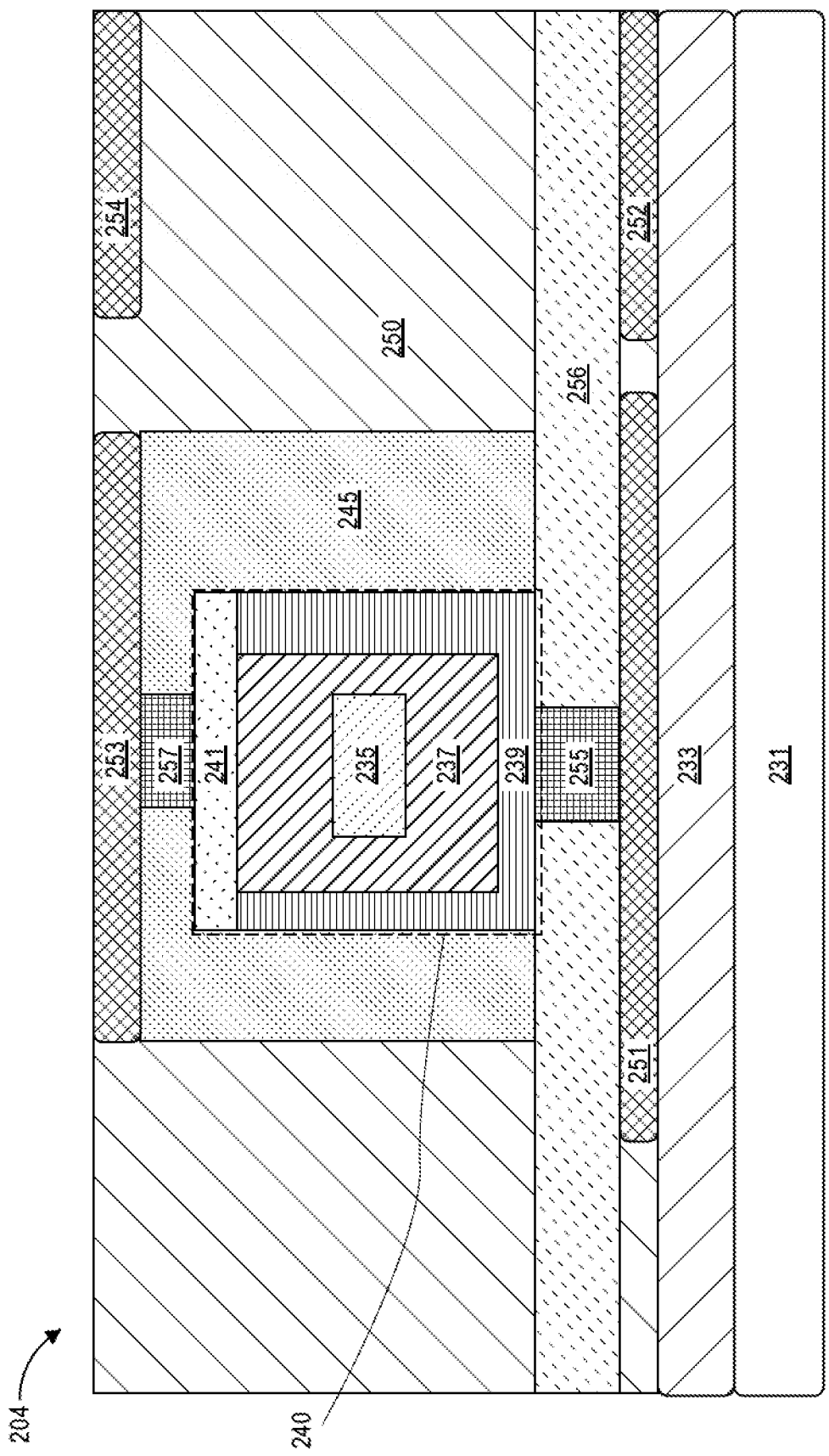
Figure 2C:
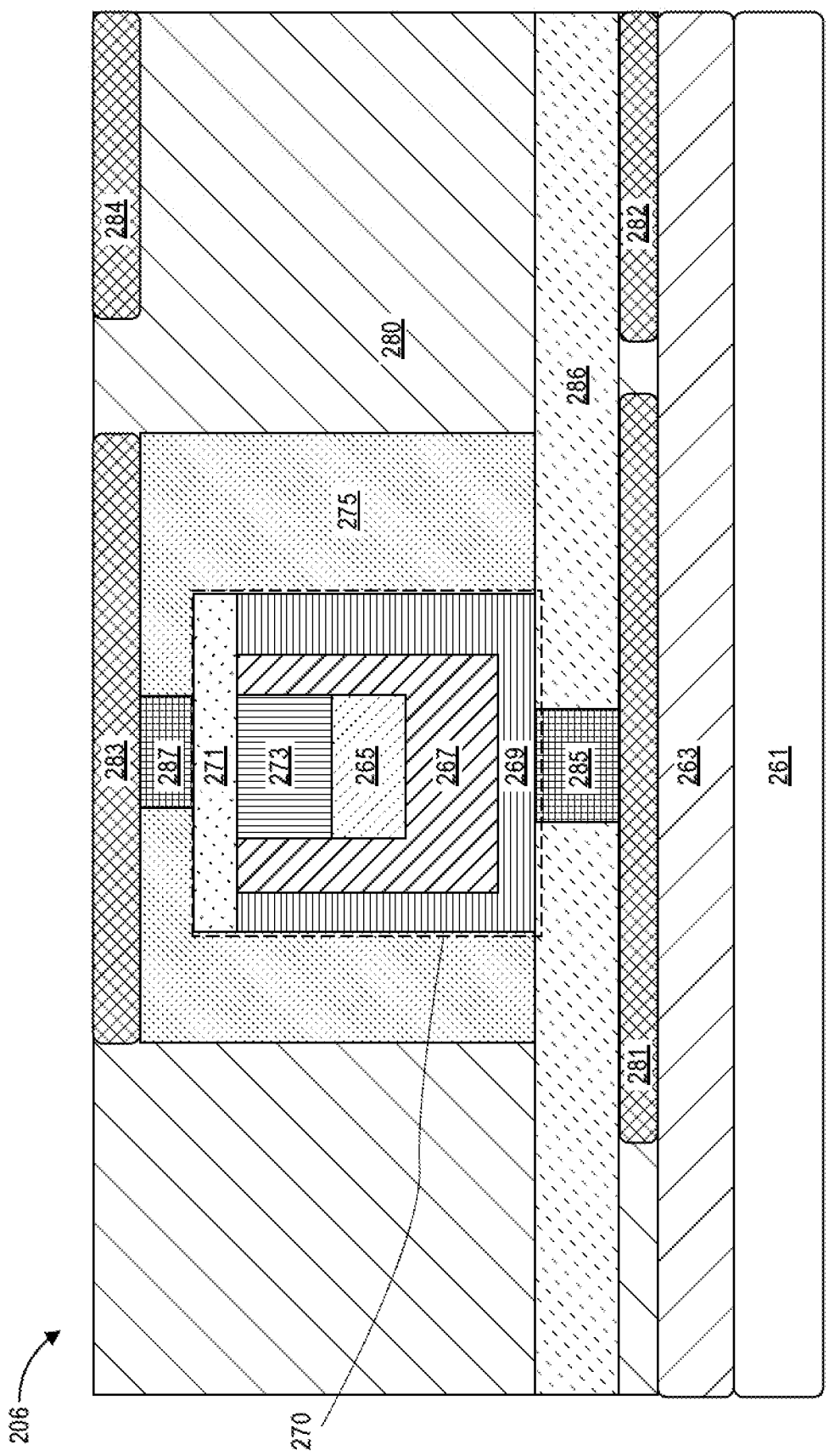

FIGS. 2(a)-2(c) schematically illustrate diagrams of various vertical TFTs between metal layers, in accordance with some embodiments. In embodiments, a vertical TFT 210 shown in FIG. 2(a), a vertical TFT 240 shown in FIG. 2(b), and a vertical TFT 270 shown in FIG. 2(c), may be an example of the vertical TFT 110 shown in FIG. 1.

As shown in FIG. 2(a), an IC 202 includes a substrate 201, an ILD layer 203 above the substrate 201, and the vertical TFT 210 above the substrate 201 and the ILD layer 203. The vertical TFT 210 includes a gate electrode 205 above the substrate 201, a gate dielectric layer 207, a channel layer 209, a first short via 225, a first metal electrode 221, a second short via 227, and a second metal electrode 223. A passivation layer 215 is around the channel layer 209 and the second short via 227. The first short via 225 is within or through an etching stop layer 226. The first metal electrode 221 is located in the metal layer 222, the second metal electrode 223 is located in the metal layer 224, and the metal layer 222 is separated from the metal layer 224 by an ILD layer 220. The gate electrode 205, the gate dielectric layer 207, the channel layer 209, the first short via 225, and the second short via 227 are within the ILD layer 220 above the substrate 201.

In embodiments, a spacer 213 is adjacent to the gate electrode 205, and around the sidewall of the gate electrode 205 not conformally covered by the gate dielectric layer 207. A metal sealant layer 211 is adjacent to the channel layer 209, and the second short via 227 is coupled to the metal sealant layer 211. The metal sealant layer 211 may include a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfaO_x$, $TaSiO_x$, $HfSiO_x$, $TaAlO_x$, $HfAlO_x$, $AlSiO_x$, $AlSiN_x$, and HYO.

In embodiments, the substrate 201 is oriented in a horizontal direction. The gate electrode 205 is above the substrate 201, oriented in a vertical direction substantially orthogonal to the horizontal direction. The gate dielectric layer 207 includes a gate dielectric material, and is oriented in the vertical direction, partially around the gate electrode 205, and above the substrate 201. The channel layer 209 includes a channel material, and is oriented in the vertical direction, around the gate dielectric layer 207, and above the substrate 201. The first short via 225 is below the channel layer 209, in contact with a first portion of the channel layer 209, and separated from the gate electrode 205. The first short via 225 is to couple the first metal electrode 221 located in the metal layer 222 to the channel layer 209. The second short via 227 is above the metal sealant layer 211, in contact with the metal sealant layer 211, and separated from the gate electrode 205.

As shown in FIG. 2(b), an IC 204 includes a substrate 231, an ILD layer 233 above the substrate 231, and the vertical TFT 240 above the substrate 231 and the ILD layer 233. The vertical TFT 240 includes a gate electrode 235 above the substrate 231, a gate dielectric layer 237, a channel layer 239, a first short via 255, a first metal electrode 251, a second short via 257, and a second metal electrode 253. A passivation layer 245 is around the channel layer 239 and the second short via 257. The first short via 255 is within or through an etching stop layer 256. The first metal electrode 251 is located in the metal layer 252, the second metal electrode 253 is located in the metal layer 254, and the metal layer 252 is separated from the metal layer 254 by an ILD layer 250. The gate electrode 235, the gate dielectric layer 237, the channel layer 239, the first short via 255, and the second short via 257 are within the ILD layer 250 above the substrate 231. A metal sealant layer 241 is adjacent to the channel layer 239, and the gate dielectric layer 237. The second short via 257 is coupled to the metal sealant layer 241.

In embodiments, the substrate 231 is oriented in a horizontal direction. The gate electrode 235 is above the substrate 231, oriented in a vertical direction substantially orthogonal to the horizontal direction. The gate dielectric layer 237 includes a gate dielectric material, and is oriented in the vertical direction, complete around the gate electrode 235, and above the substrate 231. The channel layer 239 includes a channel material, and is oriented in the vertical direction, around the gate dielectric layer 237, and above the substrate 231. The first short via 255 is below the channel layer 239, in contact with a first portion of the channel layer 239, and separated from the gate electrode 235. The first short via 255 is to couple the first metal electrode 251 located in the metal layer 252 to the channel layer 239. The second short via 257 is above the metal sealant layer 241, coupled to the metal sealant layer 241, coupled to the second metal electrode 253, and separated from the gate electrode 235.

As shown in FIG. 2(c), an IC 206 includes a substrate 261, an ILD layer 263 above the substrate 261, and the vertical TFT 270 above the substrate 261 and the ILD layer 263. The vertical TFT 270 includes a gate electrode 265 above the substrate 261, a gate dielectric layer 267, a channel layer 269, a first short via 285, a first metal electrode 281, a second short via 287, and a second metal electrode 283. A passivation layer 275 is around the channel layer 269 and the second short via 287. The first short via 285 is within or through an etching stop layer 286. The first metal electrode 281 is located in the metal layer 282, the second metal electrode 283 is located in the metal layer 284, and the metal layer 282 is separated from the metal layer 284 by an ILD layer 280. The gate electrode 265, the gate dielectric layer 267, the channel layer 269, the first short via 285, and the second short via 287 are within the ILD layer 280 above the substrate 261. A metal sealant layer 271 is adjacent to the channel layer 269, the gate dielectric layer 267, and a spacer 273. The second short via 287 is coupled to the metal sealant layer 271.

In embodiments, the substrate 261 is oriented in a horizontal direction. The gate electrode 265 is above the substrate 261, oriented in a vertical direction substantially orthogonal to the horizontal direction. The gate dielectric layer 267 includes a gate dielectric material, and is oriented in the vertical direction, partially around the gate electrode 265, and above the substrate 261. The spacer 273 is around the sidewall of the gate electrode 265 not covered by the gate dielectric layer 267. The channel layer 269 includes a channel material, and is oriented in the vertical direction, around the gate dielectric layer 267, and above the substrate 261. The first short via 285 is below the channel layer 269, in contact with a first portion of the channel layer 269, and separated from the gate electrode 265. The first short via 285 is to couple the first metal electrode 281 located in the metal layer 282 to the channel layer 269. The second short via 287 is above the metal sealant layer 271, in contact with the metal sealant layer 271, and separated from the gate electrode 265.

Figure 3:
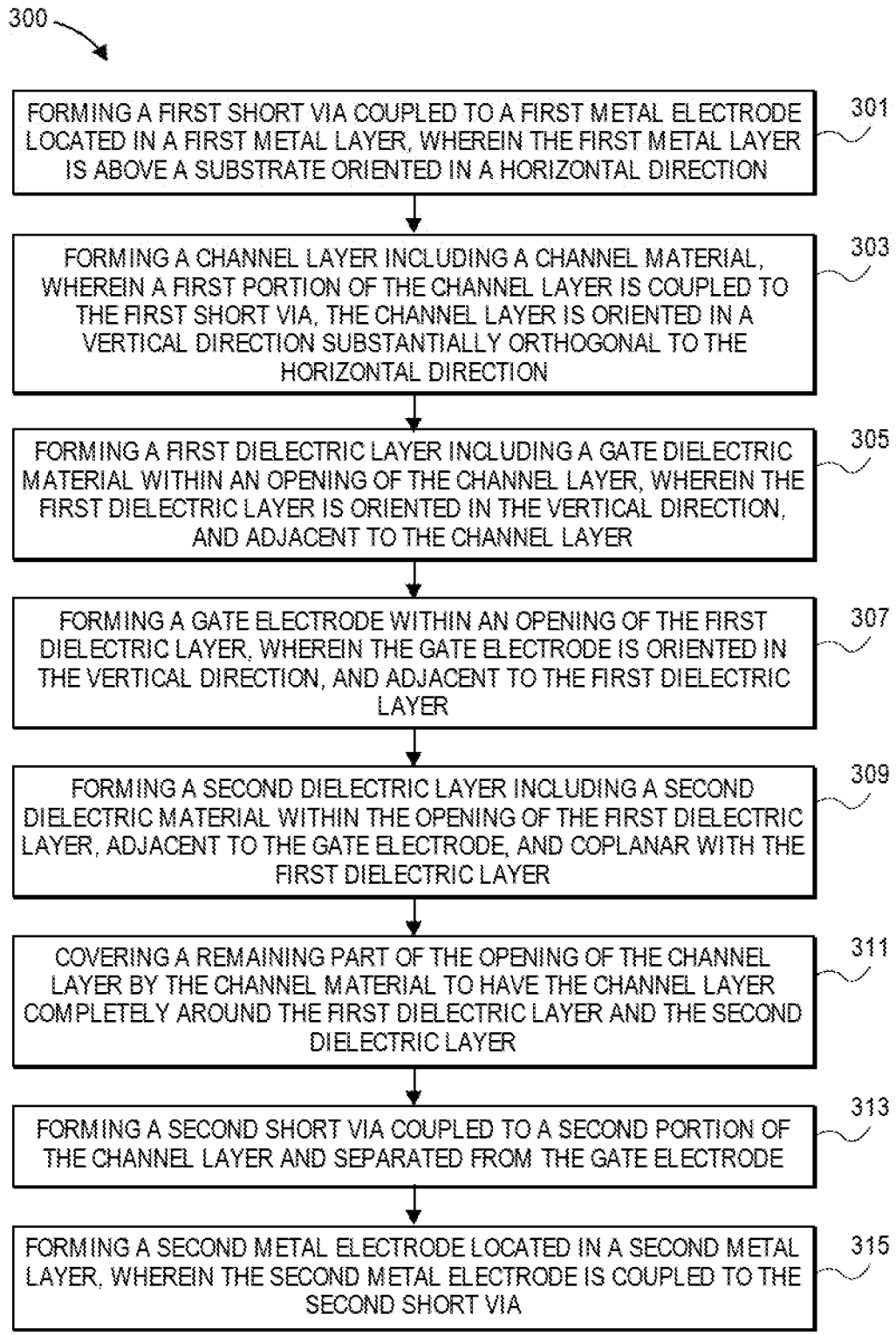
FIG. 3 illustrates a process for forming a vertical TFT between metal layers, in accordance with some embodiments.

FIG. 3 illustrates a process 300 for forming a vertical TFT between metal layers, in accordance with some embodiments. In embodiments, the process 300 or variations of the process 300 may be applied to form the vertical TFT 110 as shown in FIG. 1; the vertical TFT 210, the vertical TFT 240, or the vertical TFT 270, as shown in FIGS. 2(*a*)-2(*c*); or a vertical TFT 410 as shown in FIG. 4(*f*).

At block 301, the process 300 may include forming a first short via coupled to a first metal electrode located in a first metal layer, wherein the first metal layer is above a substrate oriented in a horizontal direction. For example, as shown in FIG. 4(*a*), the process 300 may include forming a first short via 425 coupled to a first metal electrode 421 located in a first metal layer, wherein the first metal layer is above a substrate 401 oriented in a horizontal direction. The first short via 425 is within or through an etching stop layer 426. The first short via 425 and the etching stop layer 426 are within an ILD layer 420.

In embodiments, the ILD layer 420, the first short via 425, the etching stop layer 426, the first metal electrode 423 may be formed in BEOL 440, which may be formed on the front-end-of-line (FEOL) 430. The FEOL 430 may include the substrate 401. In addition, the FEOL 430 may include other devices, e.g., a transistor 464. In embodiments, the transistor 464 may be a FEOL transistor, including a source 461, a drain 463, and a gate 465, with a channel 467 between the source 461 and the drain 463 under the gate 465.

At block 303, the process 300 may include forming a channel layer including a channel material, wherein a first portion of the channel layer is coupled to the first short via, the channel layer is oriented in a vertical direction substantially orthogonal to the horizontal direction. For example, as shown in FIG. 4(*a*), the process 300 may include forming a channel layer 409 including a channel material, wherein a first portion of the channel layer 409 is coupled to the first short via 425, the channel layer 409 is oriented in a vertical direction substantially orthogonal to the horizontal direction.

At block 305, the process 300 may include forming a first dielectric layer including a gate dielectric material within an opening of the channel layer, wherein the first dielectric layer is oriented in the vertical direction, and adjacent to the channel layer. For example, as shown in FIG. 4(*b*), the process 300 may include forming a first dielectric layer 407 including a gate dielectric material within an opening 437 of the channel layer 409, wherein the first dielectric layer 407 is oriented in the vertical direction, and adjacent to the channel layer 409.

At block 307, the process 300 may include forming a gate electrode within an opening of the first dielectric layer, wherein the gate electrode is oriented in the vertical direction, and adjacent to the first dielectric layer. For example, as shown in FIG. 4(*c*), the process 300 may include forming a gate electrode 405 within an opening 435 of the first dielectric layer 407, wherein the gate electrode 405 is oriented in the vertical direction, and adjacent to the first dielectric layer 407.

At block 309, the process 300 may include forming a second dielectric layer including a second dielectric material within the opening of the first dielectric layer, adjacent to the gate electrode, and coplanar with the first dielectric layer. For example, as shown in FIG. 4(*d*), the process 300 may include forming a second dielectric layer 413 including a second dielectric material within the opening 435 of the first dielectric layer 407, adjacent to the gate electrode 405, and coplanar with the first dielectric layer 407.

At block 311, the process 300 may include covering a remaining part of the opening of the channel layer by the channel material to have the channel layer completely around the first dielectric layer and the second dielectric layer. For example, as shown in FIG. 4(*e*), the process 300 may include covering a remaining part of the opening 437 of the channel layer 409 by the channel material to have the channel layer 409 completely around the first dielectric layer 407 and the second dielectric layer 413.

At block 313, the process 300 may include forming a second short via coupled to a second portion of the channel layer and separated from the gate electrode. For example, as shown in FIG. 4(*f*), the process 300 may include forming a second short via 427 coupled to a second portion of the channel layer 409 and separated from the gate electrode 405.

At block 315, the process 300 may include forming a second metal electrode located in a second metal layer, wherein the second metal electrode is coupled to the second short via. For example, as shown in FIG. 4(*f*), the process 300 may include forming a second metal electrode 423 located in a second metal layer, wherein the second metal electrode 423 is coupled to the second short via 427. As a result, the vertical TFT 410 is formed as shown in FIG. 4(*f*).

In addition, the process 300 may include additional operations to form other layers, e.g., ILD layers, encapsulation layers, insulation layers, not shown.

Figure 4A:
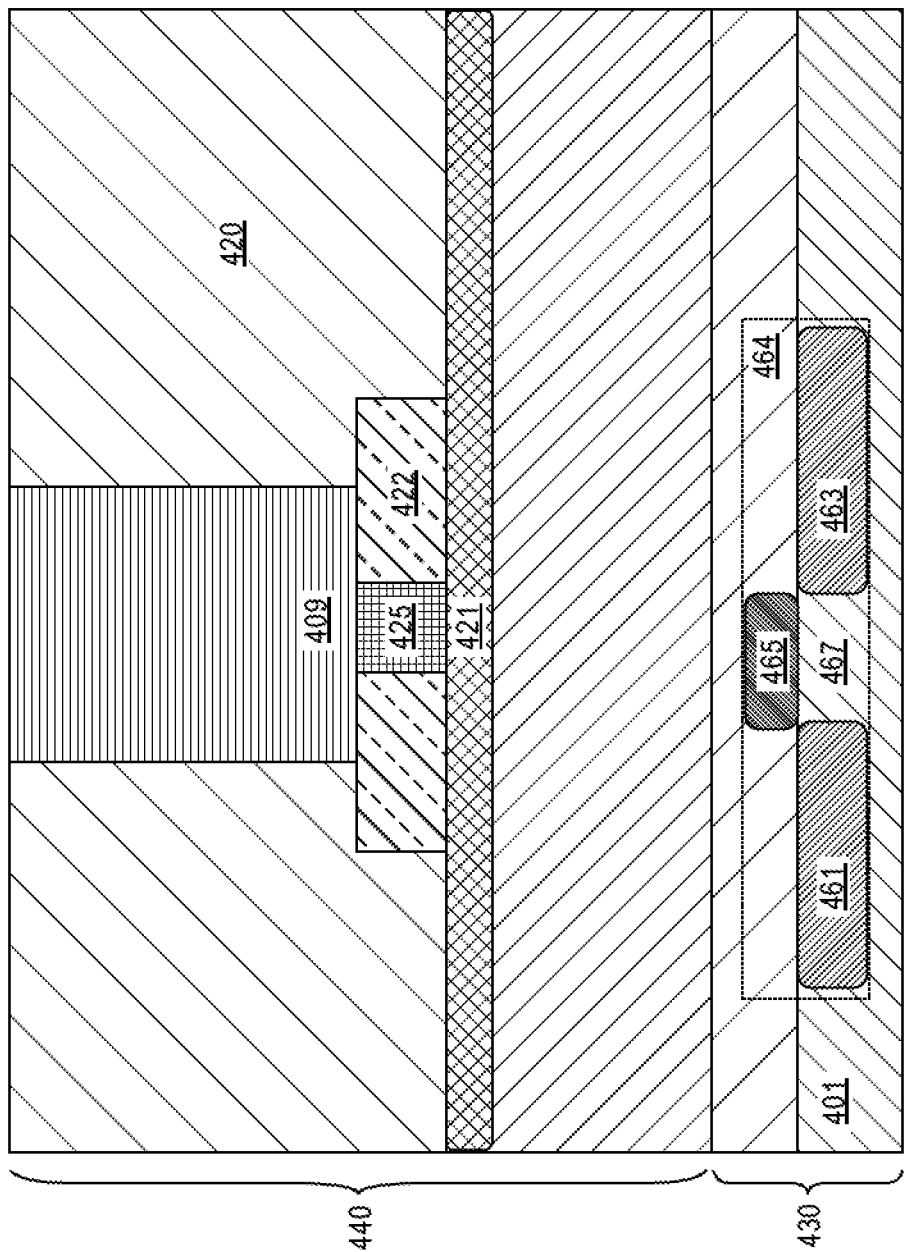
FIGS. 4(a)-4(f) illustrate a process for forming a vertical TFT between metal layers, in accordance with some embodiments.
Figure 4B:
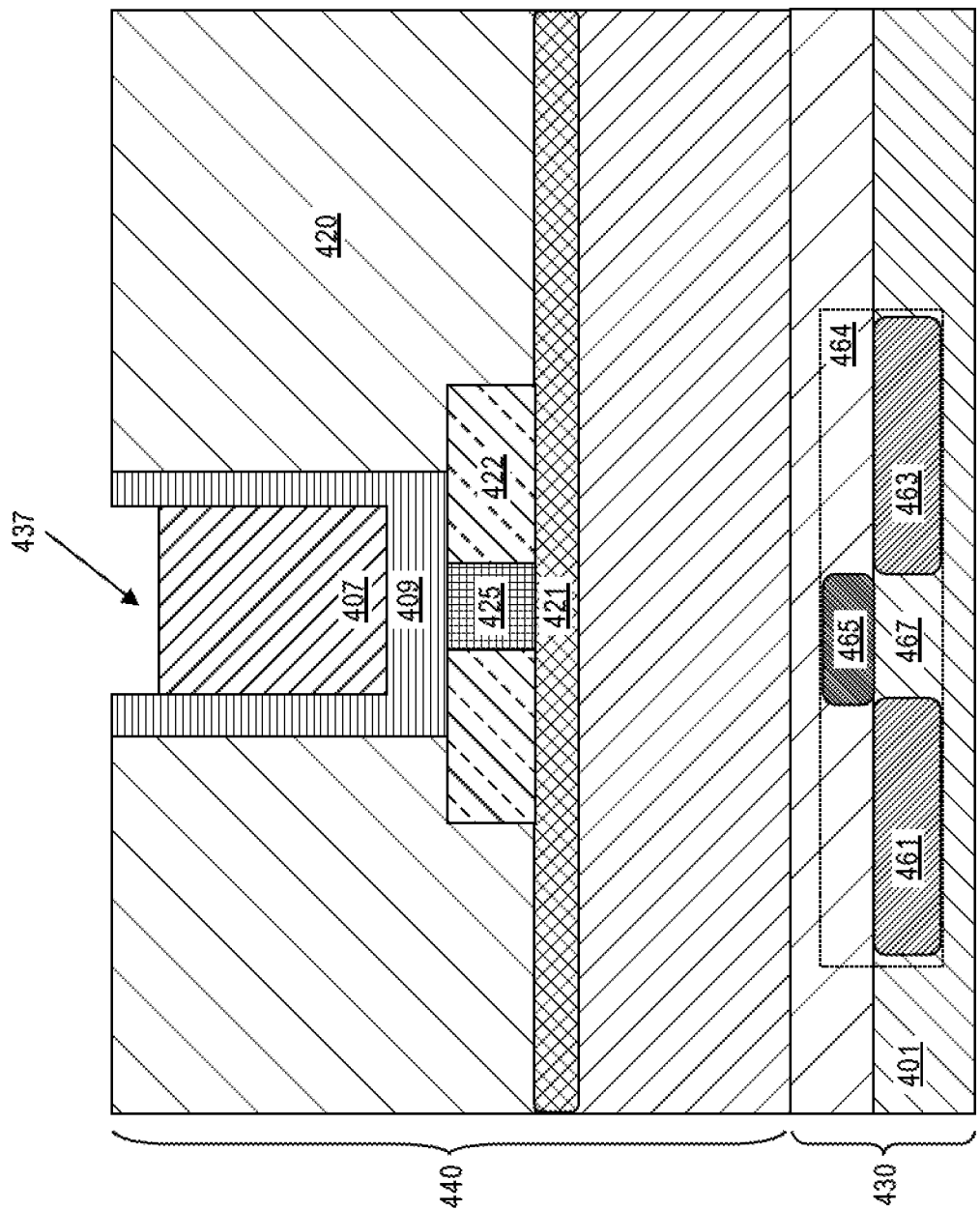
Figure 4C:
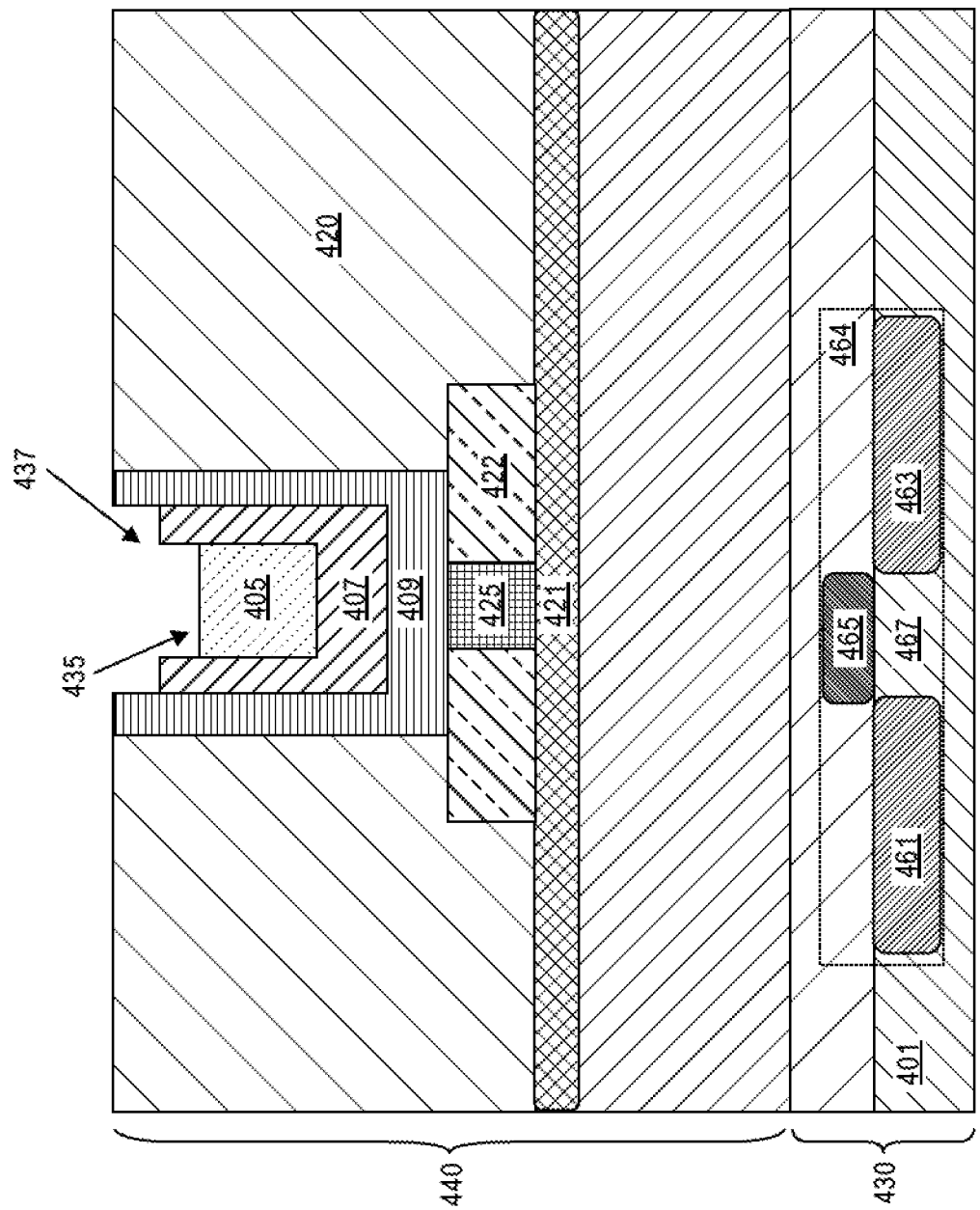
Figure 4D:
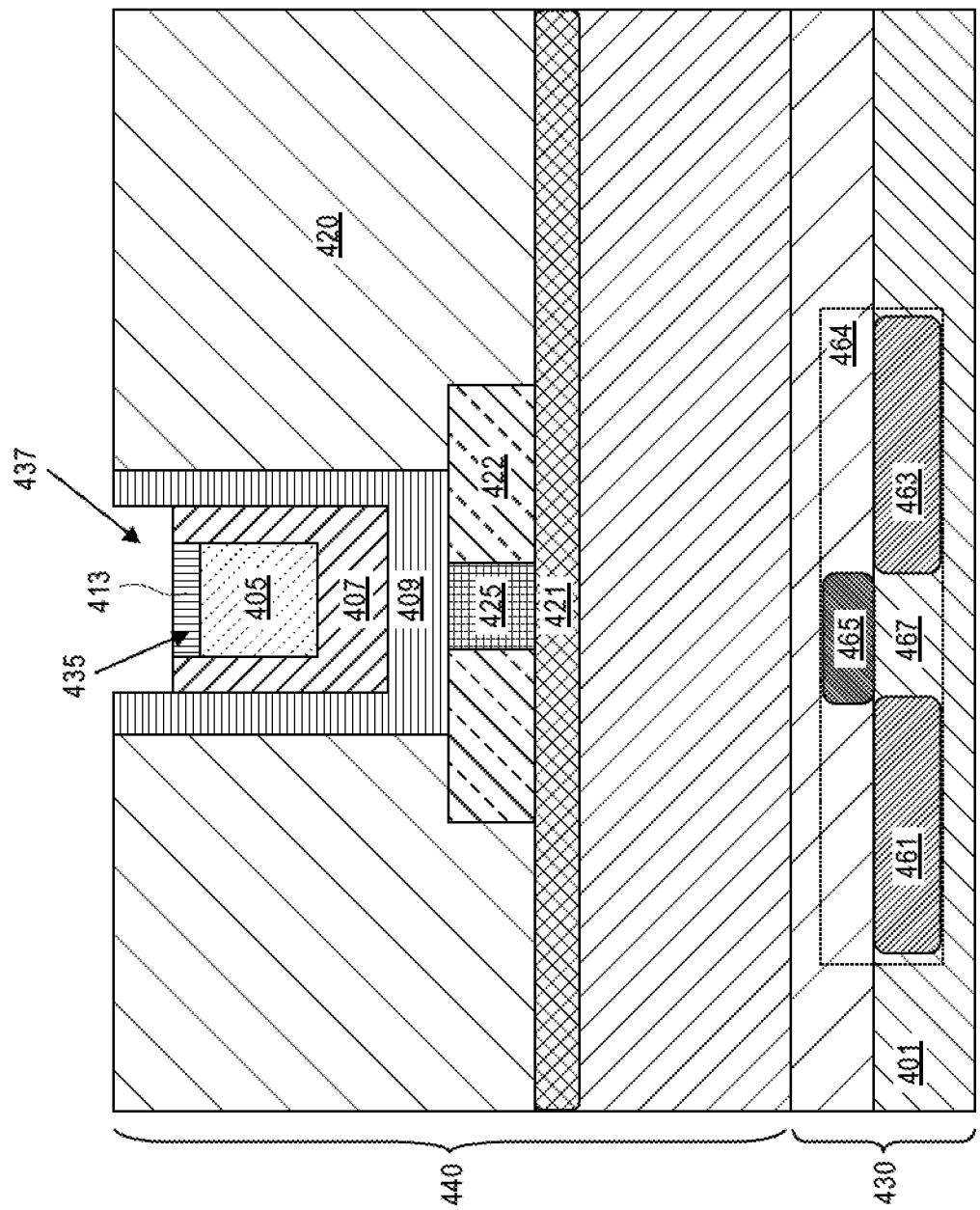
Figure 4E:
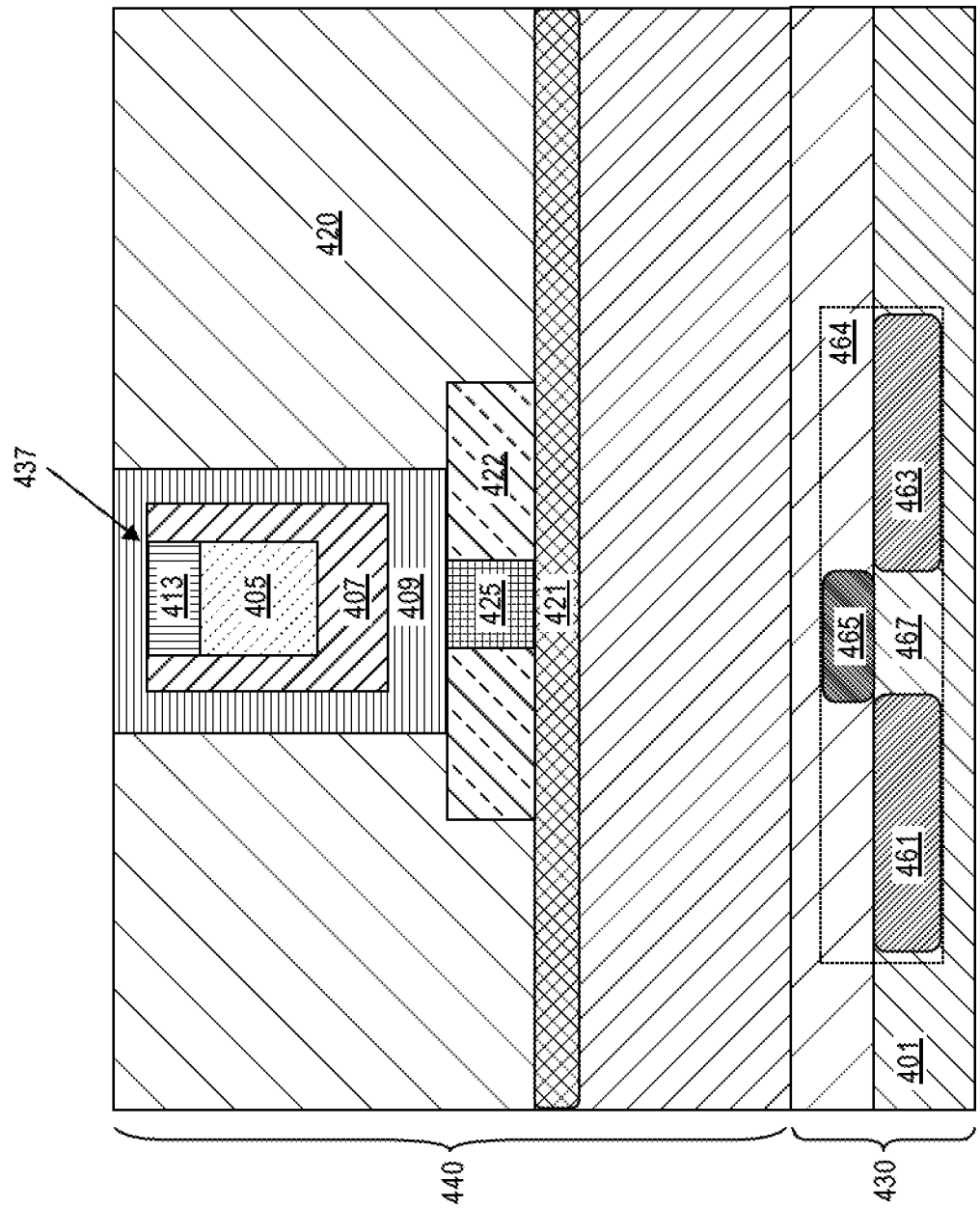
Figure 4F:
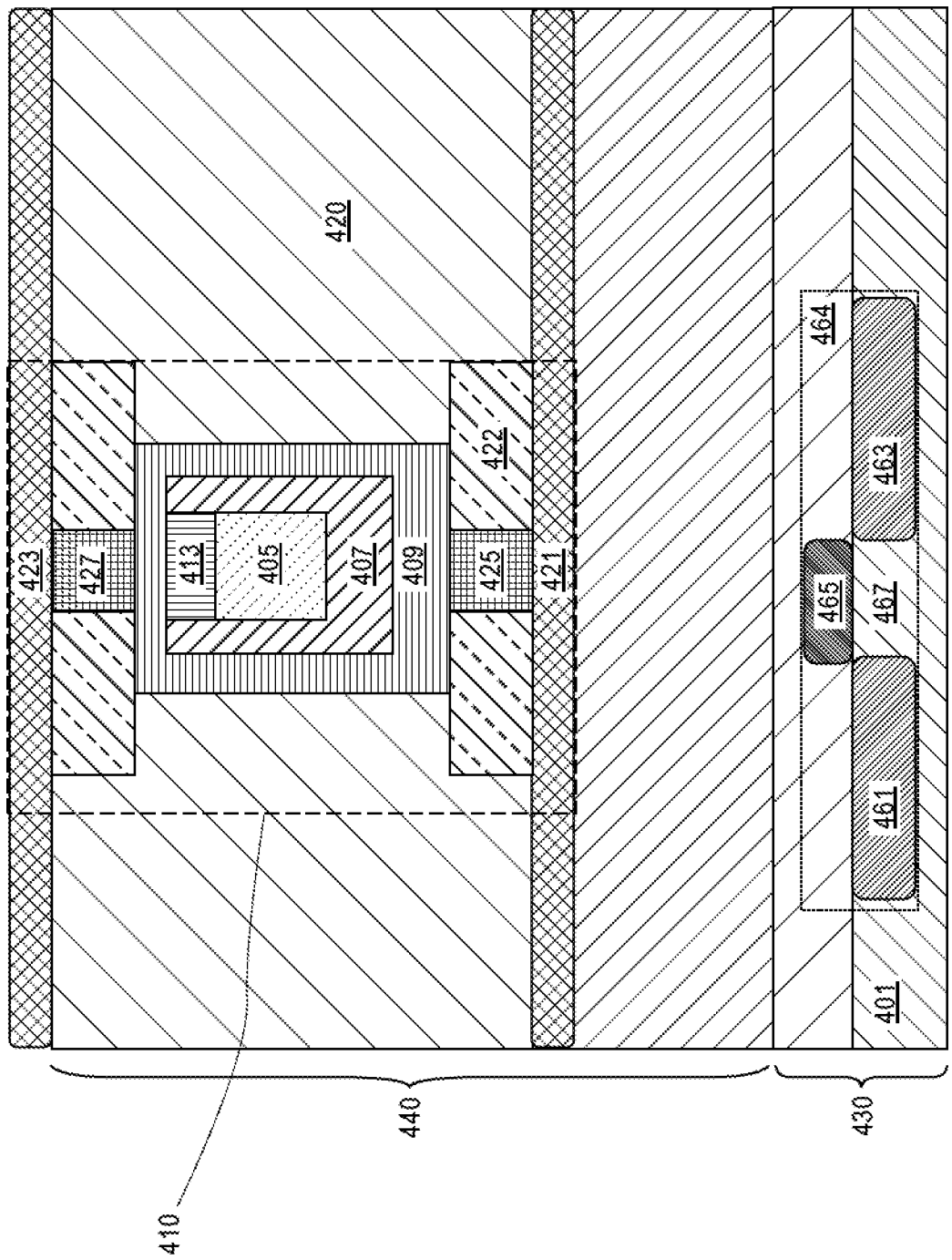
Figure 5:
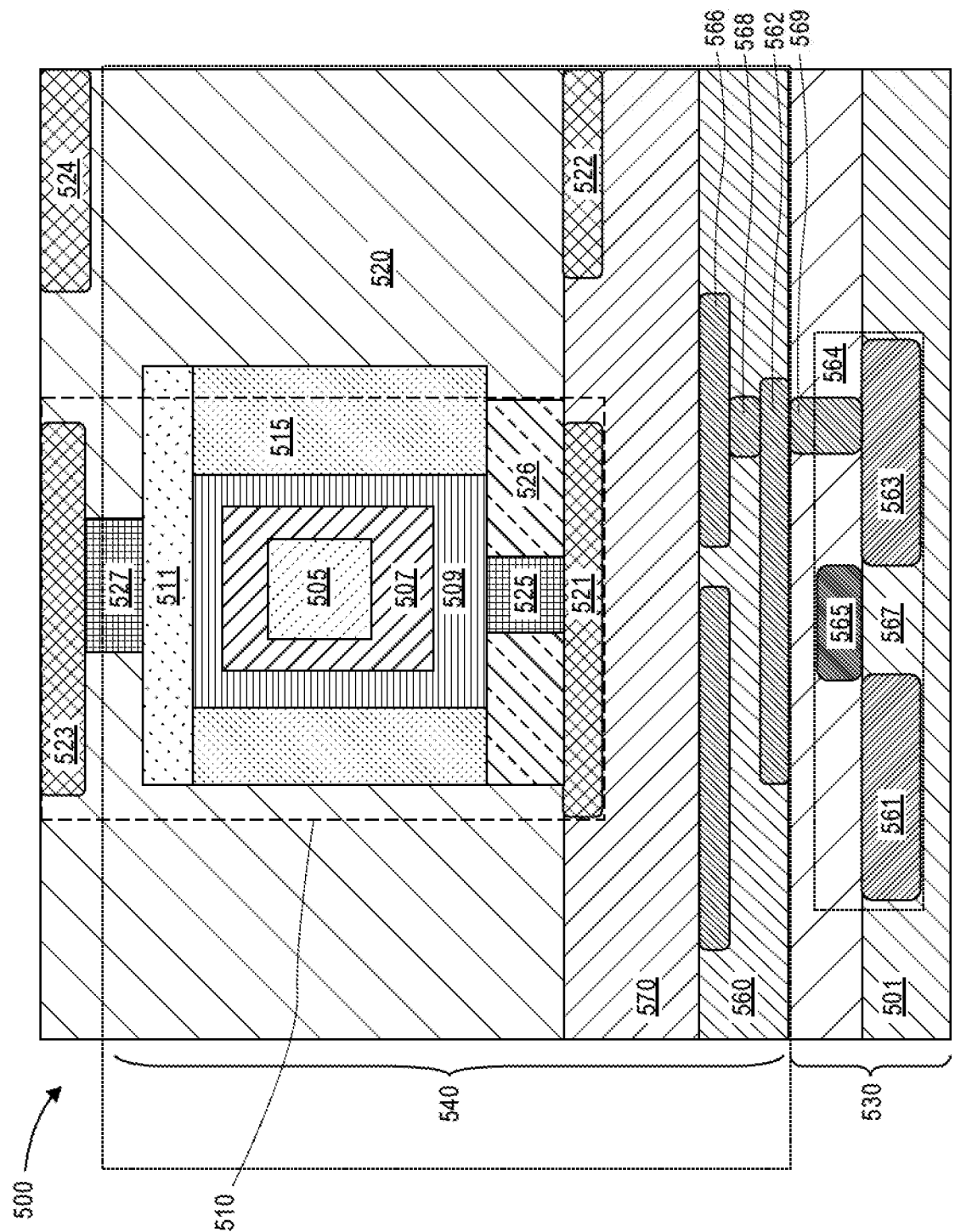
FIG. 5 schematically illustrates a diagram of vertical TFT between metal layers formed in back-end-of-line (BEOL) on a substrate, in accordance with some embodiments.

FIG. 5 schematically illustrates a diagram of vertical TFT 510 between metal layers formed in back-end-of-line (BEOL) on a substrate, in accordance with some embodiments. The vertical TFT 510 may be an example of the vertical TFT 110 as shown in FIG. 1; the vertical TFT 210, the vertical TFT 240, or the vertical TFT 270, as shown in FIG. 2(*a*)-2(*c*); or the vertical TFT 410 shown in FIG. 4(*f*).

In embodiments, an IC 500 includes a substrate 501, and the vertical TFT 510 above the substrate 501. The vertical TFT 510 includes a gate electrode 505 above the substrate 501, a gate dielectric layer 507, a channel layer 509, a first short via 525, a first metal electrode 521, a second short via 527, and a second metal electrode 523. A passivation layer 515 is around the channel layer 509 and the second short via 527. The first short via 525 is within or through an etching stop layer 526. The first metal electrode 521 is located in the metal layer 522, the second metal electrode 523 is located in the metal layer 524, and the metal layer 522 is separated from the metal layer 524 by an ILD layer 520. The gate electrode 505, the gate dielectric layer 507, the channel layer 509, the first short via 525, and the second short via 527 are within the ILD layer 520 above the substrate 501. A metal sealant layer 511 is adjacent to the channel layer 509. The second short via 527 is coupled to the metal sealant layer 511.

In embodiments, the substrate 501 is oriented in a horizontal direction. The gate electrode 505 is above the substrate 501, oriented in a vertical direction substantially orthogonal to the horizontal direction. The gate dielectric layer 507 includes a gate dielectric material, and is oriented in the vertical direction, completely around the gate electrode 505, and above the substrate 501. The channel layer 509 includes a channel material, and is oriented in the vertical direction, around the gate dielectric layer 507, and above the substrate 501. The first short via 525 is below the channel layer 509, in contact with a first portion of the channel layer 509, and separated from the gate electrode 505. The first short via 525 is to couple the first metal electrode 521 located in the metal layer 522 to the channel layer 509. The second short via 527 is above the metal sealant layer 511, in contact with the metal sealant layer 511, and separated from the gate electrode 505.

In embodiments, the vertical TFT 510 may be formed at the BEOL 540. In addition to the TFT 510, the BEOL 540 may further include a dielectric layer 560 and a dielectric layer 570. One or more vias, e.g., a via 568, may be connected to one or more interconnect, e.g., an interconnect 566, and an interconnect 562 within the dielectric layer 560. In embodiments, the interconnect 566 and the interconnect 562 may be of different metal layers at the BEOL 540. The dielectric layer 560 is shown for example only. Although not shown by FIG. 5, in various embodiments there may be multiple dielectric layers included in the BEOL 540.

In embodiments, the BEOL 540 may be formed on the FEOL 530. The FEOL 530 may include the substrate 501. In addition, the FEOL 530 may include other devices, e.g., a transistor 564. In embodiments, the transistor 564 may be a FEOL transistor, including a source 561, a drain 563, and a gate 565, with a channel 567 between the source 561 and the drain 563 under the gate 565. Furthermore, the transistor 564 may be coupled to interconnects, e.g., the interconnect 562, through a via 569.

Figure 6:
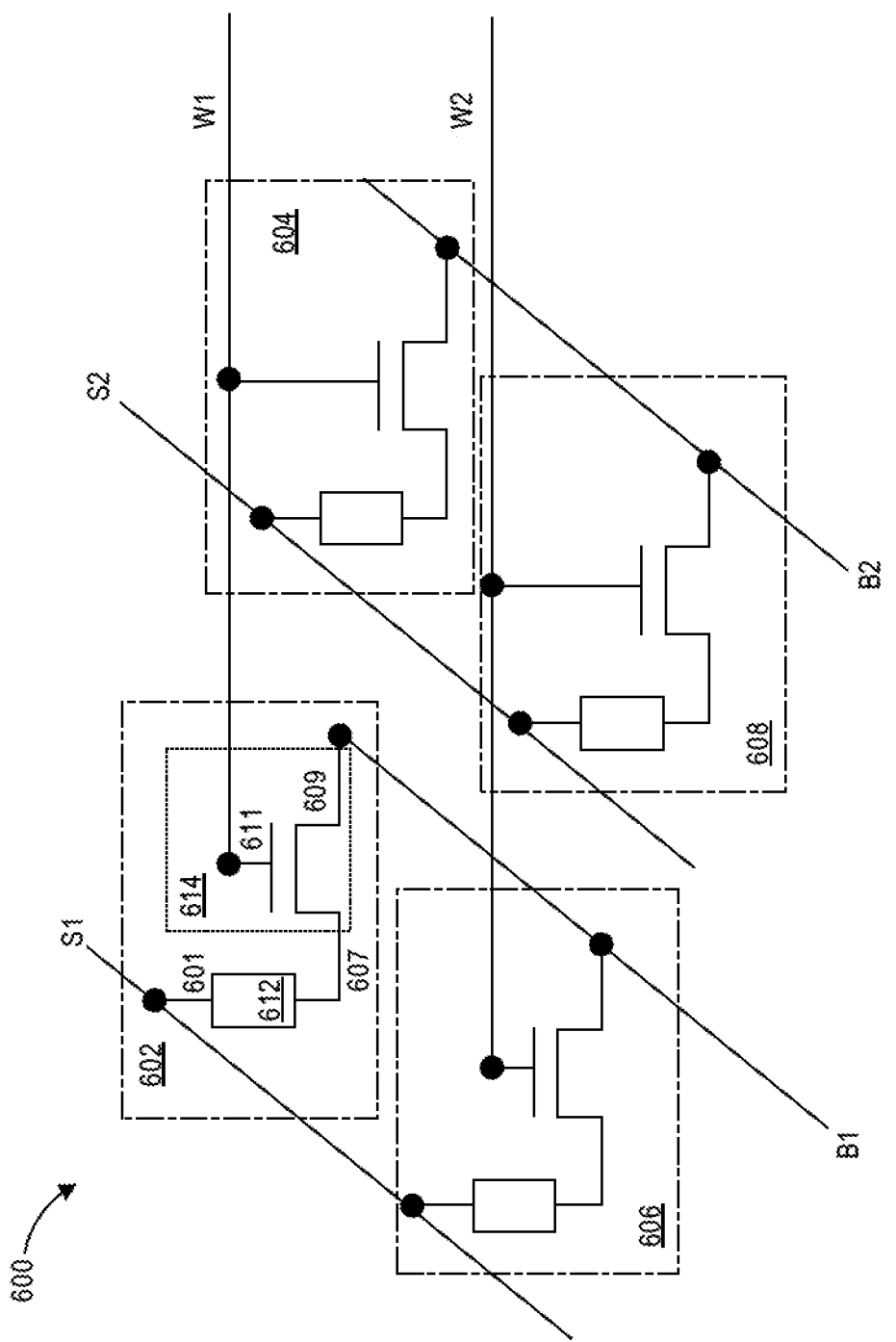
FIG. 6 schematically illustrates a memory array with multiple memory cells, where a TFT may be a selector of a memory cell, in accordance with some embodiments.

FIG. 6 schematically illustrates a memory array 600 with multiple memory cells (e.g., a memory cell 602, a memory cell 604, a memory cell 606, and a memory cell 608), where a TFT, e.g., a TFT 614, may be a selector of a memory cell, e.g., the memory cell 602, in accordance with various embodiments. In embodiments, the TFT 614 may be an example of the vertical TFT 110 as shown in FIG. 1; the vertical TFT 210, the vertical TFT 240, or the vertical TFT 270, as shown in FIG. 2(a)-2(c); the vertical TFT 410 as shown in FIG. 4(f); the vertical TFT 510 as shown in FIG. 5; or a vertical TFT made by the process 300 as shown in FIG. 3. The TFT 614 may include a gate electrode 611 coupled to a word line W1.

In embodiments, the multiple memory cells may be arranged in a number of rows and columns coupled by bit lines, e.g., bit line B1 and bit line B2, word lines, e.g., word line W1 and word line W2, and source lines, e.g., source line S1 and source line S2. The memory cell 602 may be coupled in series with the other memory cells of the same row, and may be coupled in parallel with the memory cells of the other rows. The memory array 600 may include any suitable number of one or more memory cells.

In embodiments, multiple memory cells, such as the memory cell 602, the memory cell 604, the memory cell 606, and the memory cell 608, may have a similar configuration. For example, the memory cell 602 may include the TFT 614 coupled to a storage cell 612 that may be a capacitor, which may be called a 1T1C configuration. The memory cell 602 may be controlled through multiple electrical connections to read from the memory cell, write to the memory cell, and/or perform other memory operations. In some embodiments, the storage cell 612 may be another type of storage device, e.g., a resistive random access memory (RRAM) cell.

The TFT 614 may be a selector for the memory cell 602. A word line W1 of the memory array 600 may be coupled to a gate electrode 611 of the TFT 614. When the word line W1 is active, the TFT 614 may select the storage cell 612. A source line Si of the memory array 600 may be coupled to an electrode 601 of the storage cell 612, while another electrode 607 of the storage cell 612 may be shared with the TFT 614. In addition, a bit line B1 of the memory array 600 may be coupled to another electrode, e.g., an electrode 609 of the TFT 614. The shared electrode 607 may be a source electrode or a drain electrode of the TFT 614, while the electrode 609 may be a drain electrode or a source electrode of the TFT 614. A drain electrode and a source electrode may be used interchangeably herein. Additionally, a source line and a bit line may be used interchangeably herein.

In various embodiments, the memory cells and the transistors, e.g., the memory cell 602 and the TFT 614, included in the memory array 600 may be formed in BEOL, as shown in FIG. 4. For example, the TFT 614 may be illustrated as the vertical TFT 510 shown in FIG. 5 at the BEOL. Accordingly, the memory array 600 may be formed in higher metal layers, e.g., metal layer 3 and/or metal layer 4, of the integrated circuit above the active substrate region, and may not occupy the active substrate area that is occupied by conventional transistors or memory devices.

Figure 7:
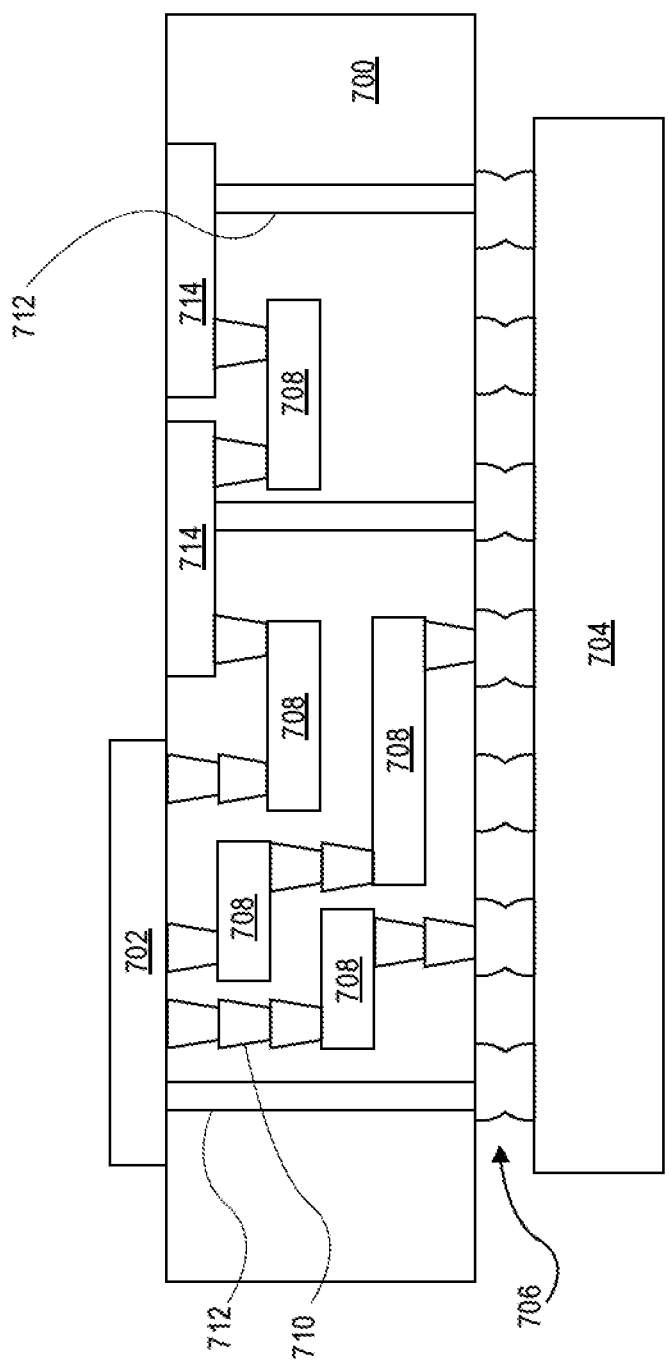
FIG. 7 schematically illustrates an interposer implementing one or more embodiments of the disclosure, in accordance with some embodiments.

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for a TFT, e.g., the vertical TFT 110 as shown in FIG. 1; the vertical TFT 210, the vertical TFT 240, or the vertical TFT 270, as shown in FIG. 2(a)-2(c); the vertical TFT 410 as shown in FIG. 4(f); the vertical TFT 510 as shown in FIG. 5; or a vertical TFT made by the process 300 as shown in FIG. 3. The second substrate 704 may be, for instance, a memory module, a computer motherboard, or another integrated circuit die. For example, the second substrate 704 may be a memory module including the memory array 600 as shown in FIG. 6. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
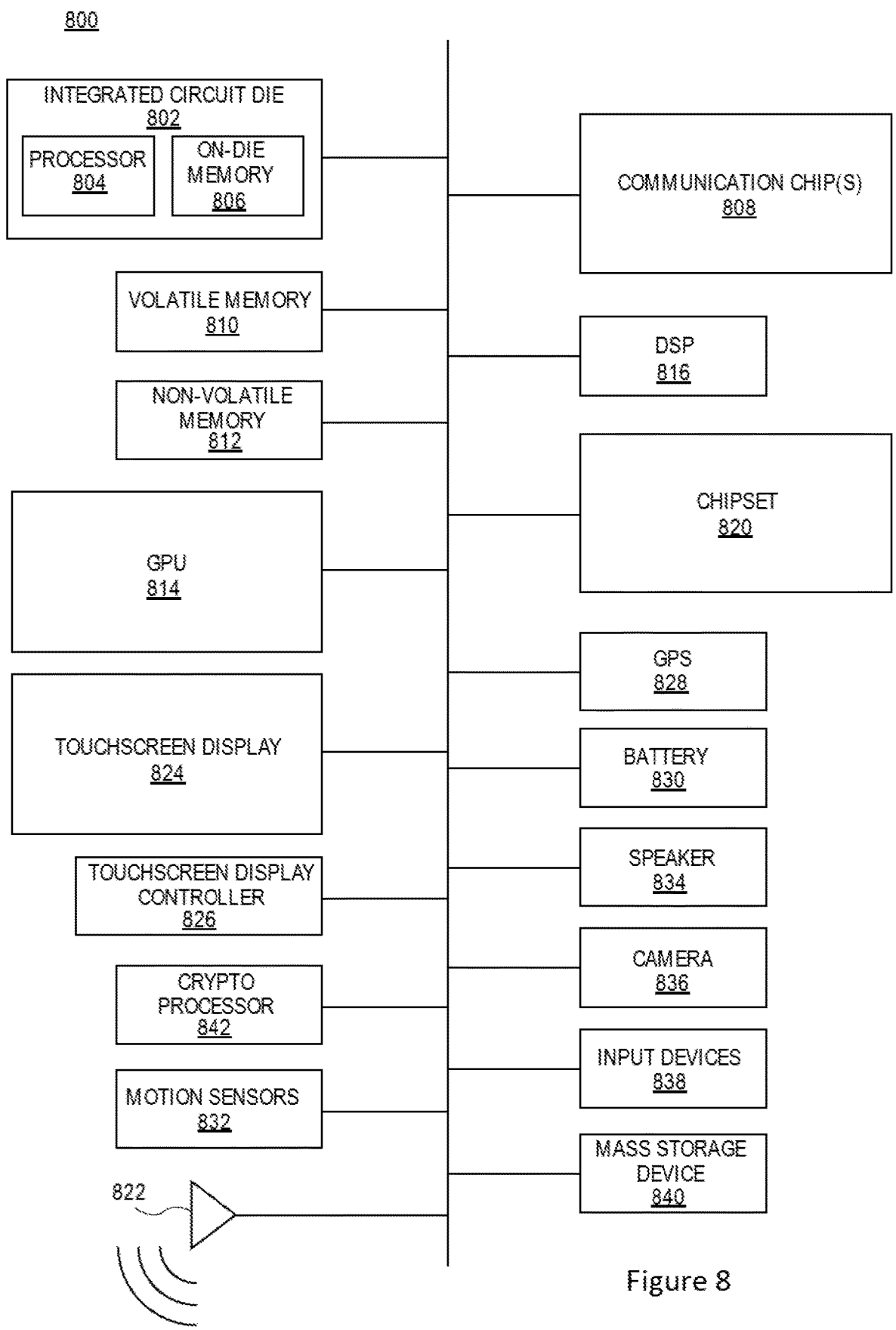
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806 may include the vertical TFT 110 as shown in FIG. 1; the vertical TFT 210, the vertical TFT 240, or the vertical TFT 270, as shown in FIG. 2(*a*)-2(*b*); the vertical TFT 410 as shown in FIG. 4(*f*); the vertical TFT 510 as shown in FIG. 5; or a vertical TFT made by the process 300 as shown in FIG. 3.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (µLED) display, or others. For example, the touchscreen display 824 may include the vertical TFT 110 as shown in FIG. 1; the vertical TFT 210, the vertical TFT 240, or the vertical TFT 270, as shown in FIG. 2(*a*)-2(*c*); the vertical TFT 410 as shown in FIG. 4(*f*); the vertical TFT 510 as shown in FIG. 5; or a vertical TFT made by the process 300 as shown in FIG. 3.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

In further embodiments, another component housed within the computing device 800 may contain one or more devices, such as DRAM, that are formed in accordance with implementations of the current disclosure, e.g., the vertical TFT 110 as shown in FIG. 1; the vertical TFT 210, the vertical TFT 240, or the vertical TFT 270, as shown in FIG. 2(*a*)-2(*c*); the vertical TFT 410 as shown in FIG. 4; the vertical TFT 510 as shown in FIG. 5; or a vertical TFT made by the process 300 as shown in FIG. 3.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are provided below.

Example 1 may include a semiconductor device, comprising: a substrate oriented in a horizontal direction; a transistor above the substrate, wherein the transistor includes: a gate electrode above the substrate, oriented in a vertical direction substantially orthogonal to the horizontal direction; a gate dielectric layer including a gate dielectric material, the gate dielectric layer oriented in the vertical direction, around the gate electrode, and above the substrate; a channel layer including a channel material, the channel layer oriented in the vertical direction, around the gate dielectric layer, and above the substrate; a first metal electrode located in a first metal layer, and a first short via below the channel layer, wherein the first metal electrode is coupled to the first short via, and the first short via is coupled to a first portion of the channel layer and separated from the gate electrode; and a second metal electrode located in a second metal layer, and a second short via above the channel layer, wherein the second metal electrode is coupled to the second short via, and the second short via is coupled to a second portion of the channel layer and separated from the gate electrode.

Example 2 may include the semiconductor device of example 1 and/or some other examples herein, wherein a cross section of the channel layer is of a shape selected from the group consisting of a rectangular shape, a circular shape, a triangular shape, a square shape, and a polygon shape.

Example 3 may include the semiconductor device of example 1 and/or some other examples herein, wherein a cross section of the channel layer is of a rectangular shape with a width of a minimal feature size.

Example 4 may include the semiconductor device of example 1 and/or some other examples herein, wherein the first short via is within or through an etching stop layer adjacent to the first metal layer, or the second short via is within or through an etching stop layer adjacent to the second metal layer.

Example 5 may include the semiconductor device of example 1 and/or some other examples herein, wherein the second metal layer is separated from the first metal layer by an inter-level dielectric (ILD) layer.

Example 6 may include the semiconductor device of example 5 and/or some other examples herein, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

Example 7 may include the semiconductor device of example 1 and/or some other examples herein, further comprising: a passivation layer around the channel layer.

Example 8 may include the semiconductor device of example 1 and/or some other examples herein, further comprising: a spacer, wherein the gate electrode is adjacent to the spacer and the gate dielectric layer.

Example 9 may include the semiconductor device of example 1 and/or some other examples herein, further comprising: a metal sealant layer, wherein the first short via or the second short via is coupled to the metal sealant layer, and the metal sealant layer is adjacent to the channel layer.

Example 10 may include the semiconductor device of example 9 and/or some other examples herein, wherein the metal sealant layer is adjacent to the gate dielectric layer and the channel layer.

Example 11 may include the semiconductor device of example 9 and/or some other examples herein, wherein the metal sealant layer is adjacent to a spacer, the gate dielectric layer, and the channel layer, wherein the spacer is adjacent to the gate electrode.

Example 12 may include the semiconductor device of example 9 and/or some other examples herein, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

Example 13 may include the semiconductor device of example 1 and/or some other examples herein, wherein the gate dielectric material is a high-K dielectric material that includes a material selected from the group consisting of hafnium silicate, zirconium silicate, hafnium dioxide, zirconium dioxide, aluminum oxide, and nitride hafnium silicate.

Example 14 may include the semiconductor device of example 1 and/or some other examples herein, wherein the substrate includes a silicon substrate, a glass substrate, a metal substrate, or a plastic substrate.

Example 15 may include the semiconductor device of example 1 and/or some other examples herein, wherein the gate electrode, the first metal electrode, or the second metal electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, and an alloy of Ti, Mo, Au, Pt, Al, Ni, Cu, Cr, TiAlN, HfAlN, or InAlO.

Example 16 may include the semiconductor device of example 1 and/or some other examples herein, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

Example 17 may include a method for forming a vertical thin film transistor (TFT), the method comprising: forming a first short via coupled to a first metal electrode located in a first metal layer, wherein the first metal layer is above a substrate oriented in a horizontal direction; forming a channel layer including a channel material, wherein a first portion of the channel layer is coupled to the first short via, the channel layer is oriented in a vertical direction substantially orthogonal to the horizontal direction; forming a first dielectric layer including a gate dielectric material within an opening of the channel layer, wherein the first dielectric layer is oriented in the vertical direction, and adjacent to the channel layer; forming a gate electrode within an opening of the first dielectric layer, wherein the gate electrode is oriented in the vertical direction, and adjacent to the first dielectric layer; forming a second dielectric layer including a second dielectric material within the opening of the first dielectric layer, adjacent to the gate electrode, and coplanar with the first dielectric layer; forming a second short via coupled to a second portion of the channel layer and separated from the gate electrode; and forming a second metal electrode located in a second metal layer, wherein the second metal electrode is coupled to the second short via.

Example 18 may include the method of example 17 and/or some other examples herein, wherein the second dielectric layer is a spacer.

Example 19 may include the method of example 17 and/or some other examples herein, further comprising: covering a remaining part of the opening of the channel layer by the channel material to have the channel layer completely around the first dielectric layer and the second dielectric layer.

Example 20 may include the method of example 17 and/or some other examples herein, wherein the second dielectric material in the second dielectric layer is the same as the gate dielectric material in the first dielectric layer, and the first dielectric layer is completely around the gate electrode.

Example 21 may include the method of example 17 and/or some other examples herein, further comprising: forming a metal sealant layer above the channel layer and separated from the gate electrode before forming the second short via; and forming the second short via coupled to the metal sealant layer.

Example 22 may include a computing device, comprising: a circuit board; and a memory device coupled to the circuit board and including a memory array, wherein the memory array includes a plurality of memory cells, a memory cell of the plurality of memory cells includes a transistor and a storage cell, and wherein the transistor includes: a gate electrode coupled to a word line of the memory array, wherein a substrate is below the gate electrode in a horizontal direction, and the gate electrode is above the substrate, oriented in a vertical direction substantially orthogonal to the horizontal direction; a gate dielectric layer including a gate dielectric material, the gate dielectric layer oriented in the vertical direction, around the gate electrode, and above the substrate; a channel layer including a channel material, the channel layer oriented in the vertical direction, around the gate dielectric layer, and above the substrate; a first metal electrode located in a first metal layer, and a first short via above the channel layer, wherein the first metal electrode is coupled to the first short via, the first short via is coupled to a first portion of the channel layer and separated from the gate electrode, and the first metal electrode is coupled to a bit line of the memory array; and a second metal electrode located in a second metal layer, and a second short via below the channel layer, wherein the second metal electrode is coupled to the second short via, the second short via is coupled to a second portion of the channel layer and separated from the gate electrode, and the second metal electrode is coupled to a first electrode of the storage cell; and the storage cell further includes a second electrode coupled to a source line of the memory array.

Example 23 may include computing device of example 22 and/or some other examples herein, wherein the transistor further includes a metal sealant layer, the first short via or the second short via is coupled to the metal sealant layer, and the metal sealant layer is adjacent to the channel layer.

Example 24 may include computing device of example 23 and/or some other examples herein, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

Example 25 may include computing device of example 22 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A semiconductor device, comprising:
   a substrate oriented in a horizontal direction;
   a transistor above the substrate, wherein the transistor includes:
   a gate electrode above the substrate, oriented in a vertical direction substantially orthogonal to the horizontal direction;
   a gate dielectric layer including a gate dielectric material, the gate dielectric layer oriented in the vertical direction, around the gate electrode, and above the substrate;
   a channel layer including a channel material, the channel layer oriented in the vertical direction, around the gate dielectric layer, and above the substrate;
   a first metal electrode located in a first metal layer, and a first short via below the channel layer, wherein the first metal electrode is coupled to the first short via, and the first short via is coupled to a first portion of the channel layer and separated from the gate electrode; and
   a second metal electrode located in a second metal layer, and a second short via above the channel layer, wherein the second metal electrode is coupled to the second short via, and the second short via is coupled to a second portion of the channel layer and separated from the gate electrode.

2. The semiconductor device of claim 1, wherein a cross section of the channel layer is of a shape selected from the group consisting of a rectangular shape, a circular shape, a triangular shape, a square shape, and a polygon shape.

3. The semiconductor device of claim 1, wherein a cross section of the channel layer is of a rectangular shape with a width of a minimal feature size.

4. The semiconductor device of claim 1, wherein the first short via is within or through an etching stop layer adjacent to the first metal layer, or the second short via is within or through an etching stop layer adjacent to the second metal layer.

5. The semiconductor device of claim 1, wherein the second metal layer is separated from the first metal layer by an inter-level dielectric (ILD) layer.

6. The semiconductor device of claim 5, wherein the ILD layer includes a material selected from the group consisting of silicon dioxide ($SiO_2$), carbon doped oxide (CDO), silicon nitride, perfluorocyclobutane, polytetrafluoroethylene, fluorosilicate glass (FSG), organic polymer, silsesquioxane, siloxane, and organosilicate glass.

7. The semiconductor device of claim 1, further comprising:
a passivation layer around the channel layer.

8. The semiconductor device of claim 1, further comprising:
a spacer, wherein the gate electrode is adjacent to the spacer and the gate dielectric layer.

9. The semiconductor device of claim 1, further comprising:
a metal sealant layer, wherein the first short via or the second short via is coupled to the metal sealant layer, and the metal sealant layer is adjacent to the channel layer.

10. The semiconductor device of claim 9, wherein the metal sealant layer is adjacent to the gate dielectric layer and the channel layer.

11. The semiconductor device of claim 9, wherein the metal sealant layer is adjacent to a spacer, the gate dielectric layer, and the channel layer, wherein the spacer is adjacent to the gate electrode.

12. The semiconductor device of claim 9, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

13. The semiconductor device of claim 1, wherein the gate dielectric material is a high-K dielectric material that includes a material selected from the group consisting of hafnium silicate, zirconium silicate, hafnium dioxide, zirconium dioxide, aluminum oxide, and nitride hafnium silicate.

14. The semiconductor device of claim 1, wherein the substrate includes a silicon substrate, a glass substrate, a metal substrate, or a plastic substrate.

15. The semiconductor device of claim 1, wherein the gate electrode, the first metal electrode, or the second metal electrode includes a material selected from the group consisting of titanium (Ti), molybdenum (Mo), gold (Au), platinum (Pt), aluminum (Al), nickel (Ni), copper (Cu), chromium (Cr), hafnium (Hf), indium (In), Mg, W, Fe, Vn, Zn, Ta, Mo, and an alloy of Ti, Mo, Au, Pt, Al, Ni, Cu, Cr, TiAlN, HfAlN, or InAlO.

16. The semiconductor device of claim 1, wherein the channel layer includes a material selected from the group consisting of $CuS_2$, $CuSe_2$, $WSe_2$, $MoS_2$, $MoSe_2$, $WS_2$, indium doped zinc oxide (IZO), zinc tin oxide (ZTO), amorphous silicon (a-Si), amorphous germanium (a-Ge), low-temperature polycrystalline silicon (LTPS), transition metal dichalcogenide (TMD), yttrium-doped zinc oxide (YZO), polysilicon, poly germanium doped with boron, poly germanium doped with aluminum, poly germanium doped with phosphorous, poly germanium doped with arsenic, indium oxide, tin oxide, zinc oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, $Si_2BN$, stanene, phosphorene, molybdenite, poly-III-V like InAs, InGaAs, InP, amorphous InGaZnO (a-IGZO), crystal-like InGaZnO (c-IGZO), GaZnON, ZnON, or C-Axis Aligned Crystal (CAAC), molybdenum and sulfur, and a group-VI transition metal dichalcogenide.

17. A method for forming a vertical thin film transistor (TFT), the method comprising:
forming a first short via coupled to a first metal electrode located in a first metal layer, wherein the first metal layer is above a substrate oriented in a horizontal direction;
forming a channel layer including a channel material, wherein a first portion of the channel layer is coupled to the first short via, the channel layer is oriented in a vertical direction substantially orthogonal to the horizontal direction;
forming a first dielectric layer including a gate dielectric material within an opening of the channel layer, wherein the first dielectric layer is oriented in the vertical direction, and adjacent to the channel layer;
forming a gate electrode within an opening of the first dielectric layer, wherein the gate electrode is oriented in the vertical direction, and adjacent to the first dielectric layer;
forming a second dielectric layer including a second dielectric material within the opening of the first dielectric layer, adjacent to the gate electrode, and coplanar with the first dielectric layer;
forming a second short via coupled to a second portion of the channel layer and separated from the gate electrode; and
forming a second metal electrode located in a second metal layer, wherein the second metal electrode is coupled to the second short via.

18. The method of claim 17, wherein the second dielectric layer is a spacer.

19. The method of claim 17, further comprising:
covering a remaining part of the opening of the channel layer by the channel material to have the channel layer completely around the first dielectric layer and the second dielectric layer.

20. The method of claim 17, wherein the second dielectric material in the second dielectric layer is the same as the gate dielectric material in the first dielectric layer, and the first dielectric layer is completely around the gate electrode.

21. The method of claim 17, further comprising:
forming a metal sealant layer above the channel layer and separated from the gate electrode before forming the second short via; and
forming the second short via coupled to the metal sealant layer.

22. A computing device, comprising:
a circuit board; and
a memory device coupled to the circuit board and including a memory array, wherein the memory array includes a plurality of memory cells, a memory cell of the plurality of memory cells includes a transistor and a storage cell, and wherein the transistor includes:
a gate electrode coupled to a word line of the memory array, wherein a substrate is below the gate electrode in a horizontal direction, and the gate electrode is above the substrate, oriented in a vertical direction substantially orthogonal to the horizontal direction;
a gate dielectric layer including a gate dielectric material, the gate dielectric layer oriented in the vertical direction, around the gate electrode, and above the substrate;
a channel layer including a channel material, the channel layer oriented in the vertical direction, around the gate dielectric layer, and above the substrate;
a first metal electrode located in a first metal layer, and a first short via above the channel layer, wherein the first metal electrode is coupled to the first short via, the first short via is coupled to a first portion of the channel layer and separated from the gate electrode, and the first metal electrode is coupled to a bit line of the memory array; and a second metal electrode located in a second metal layer, and a second short via below the channel layer, wherein the second metal electrode is coupled to the second short via, the second short via is coupled to a second portion of the channel layer and separated from the gate electrode, and the second metal electrode is coupled to a first electrode of the storage cell; and the storage cell further includes a second electrode coupled to a source line of the memory array.

23. The computing device of claim 22, wherein the transistor further includes a metal sealant layer, the first short via or the second short via is coupled to the metal sealant layer, and the metal sealant layer is adjacent to the channel layer.

24. The computing device of claim 23, wherein the metal sealant layer includes a material selected from the group consisting of TiN, AlTiN, AlTiOx, TaN, AlTaN, AlN, $WO_xN_y$, $TiO_xN_y$, $SiO_xN_y$, $Al_2O_3$, $HfO_2$, $TiO_2$, AiN, SiN, $SiO_2$, SiCOH, $Ta_2O_5$, $Y_2O_3$, $Ga_2O_3$, $ZrO_2$, HZO, YZO, $HfTaO_x$, $TaSiO_x$, $HfSiO_x$, $TaAlO_x$, $HfAlO_x$, $AlSiO_x$, $AlSiN_x$, and HYO.

25. The computing device of claim 22, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *